United States Patent
Tay

(10) Patent No.: US 7,824,944 B2
(45) Date of Patent: Nov. 2, 2010

(54) IMAGE SENSOR WITH INTER-PIXEL ISOLATION

(76) Inventor: Hiok Nam Tay, Blk. 409, Woodlands St. 41, #13-109, 730409 Singapore (SG)

(*) Notice: Subject to any disclaimer, the term of this patent is extended or adjusted under 35 U.S.C. 154(b) by 0 days.

(21) Appl. No.: 12/252,614

(22) Filed: Oct. 16, 2008

(65) Prior Publication Data
US 2009/0039400 A1 Feb. 12, 2009

(51) Int. Cl.
*H01L 21/00* (2006.01)
(52) U.S. Cl. .................... 438/48; 438/70; 257/E21.001
(58) Field of Classification Search .................... 438/48, 438/70, 6, 141, 217, 220, 224, 527
See application file for complete search history.

(56) References Cited

U.S. PATENT DOCUMENTS

| | | | |
|---|---|---|---|
| 6,072,206 A | 6/2000 | Yamashita | |
| 6,169,318 B1 | 1/2001 | McGrath | |
| 6,507,059 B2 | 1/2003 | Chen et al. | |
| 6,795,117 B2 | 9/2004 | Tay | |
| 6,878,568 B1 | 4/2005 | Rhodes et al. | |
| 6,909,162 B2 | 6/2005 | Wu et al. | |
| 7,091,536 B2 | 8/2006 | Rhodes et al. | |
| 2003/0020971 A1 | 1/2003 | Kwon | |
| 2004/0173866 A1 | 9/2004 | Egawa et al. | |
| 2006/0027732 A1 | 2/2006 | Ahn | |
| 2006/0255372 A1 | 11/2006 | Patrick et al. | |
| 2006/0267053 A1* | 11/2006 | Yang et al. .................... 257/291 |
| 2007/0029580 A1 | 2/2007 | Lung | |
| 2007/0114627 A1 | 5/2007 | Roy | |

FOREIGN PATENT DOCUMENTS

DE 199 33 162 A 1 2/2001
JP 11 233747 A 8/1999

* cited by examiner

*Primary Examiner*—W. David Coleman
*Assistant Examiner*—Latanya Crawford
(74) *Attorney, Agent, or Firm*—Irell & Manella, LLP; Ben Yorks

(57) ABSTRACT

An image sensor with a plurality of photodiodes that each is adjacent to a first region constructed from a first type of material and comprises a second region constructed from a second type of material. Located between second regions of adjacent photodiodes is a barrier region. The photodiodes are reverse biased to create depletion regions within the substrate. The barrier region limits the lateral growth of the depletion regions and inhibits depletion merger between adjacent photodiodes.

29 Claims, 2 Drawing Sheets

IMAGE SENSOR WITH INTER-PIXEL ISOLATION

REFERENCE TO CROSS RELATED APPLICATION

This application claims priority under 35 U.S.C §119(e) to provisional application No. 60/764,288 filed on Jan. 31, 2006.

BACKGROUND OF THE INVENTION

1. Field of the Invention

The subject matter disclosed generally relates to the field of semiconductor image sensors.

2. Background Information

Photographic equipment such as digital cameras and digital camcorders may contain electronic image sensors that capture light for processing into still or video images, respectively. Electronic image sensors typically contain millions of light capturing elements such as photodiodes. The photodiodes are arranged in a two-dimensional pixel array.

FIG. 1 shows an enlarged cross-section of pixels in a pixel array of the prior art. The pixels include first regions 1 constructed from a first type of material, typically p-type, and second regions 2 constructed from a second type of material, typically n-type. The substrate and second regions 2 form p-n junctions of photodiodes. The p-n junctions are reverse biased to form depletion regions between dashed lines 3 and 4. The photons of incoming light 5 are absorbed to create electron-hole pairs 6. The electrons move to create an electrical current. The current is ultimately sensed and processed to reproduce the image detected by the image sensor.

Light at relatively long wavelengths penetrate deep into the photodiodes. Consequently, electrons are formed at the outer edges of the depletion regions. The depletion regions can grow and actually merge in region 7. The merger of depletion regions electronically couples the adjacent photodiodes in a capacitance manner. A change in voltage of a photodiode receiving light may vary the voltage in an adjacent photodiode not receiving light. This will result in an inaccurate sensing of light in the adjacent photodiode. It would be desirable to provide a pixel structure that would minimize the effects of lateral depletion region growth from impinging on adjacent depletion regions.

BRIEF SUMMARY OF THE INVENTION

An image sensor with a plurality of photodiodes that each is adjacent to a first region constructed from a first type of material and comprises a second region constructed from a second type of material. Located between second regions of adjacent photodiodes is a barrier region.

DETAILED DESCRIPTION

Disclosed is an image sensor with a plurality of photodiodes that each is adjacent to a first region constructed from a first type of material in a substrate and comprises a second region constructed from a second type of material in the substrate. Located adjacent to the first region and between second regions of adjacent photodiodes is a barrier region. The photodiodes are reverse biased to create depletion regions within the substrate. The barrier region limits the lateral growth of the depletion regions and inhibits depletion region merger between adjacent photodiodes. The barrier region may be nearer to one adjacent second region than another to be more midway between light shafts that penetrate the adjacent second regions at an obtuse angle.

Figure 2:
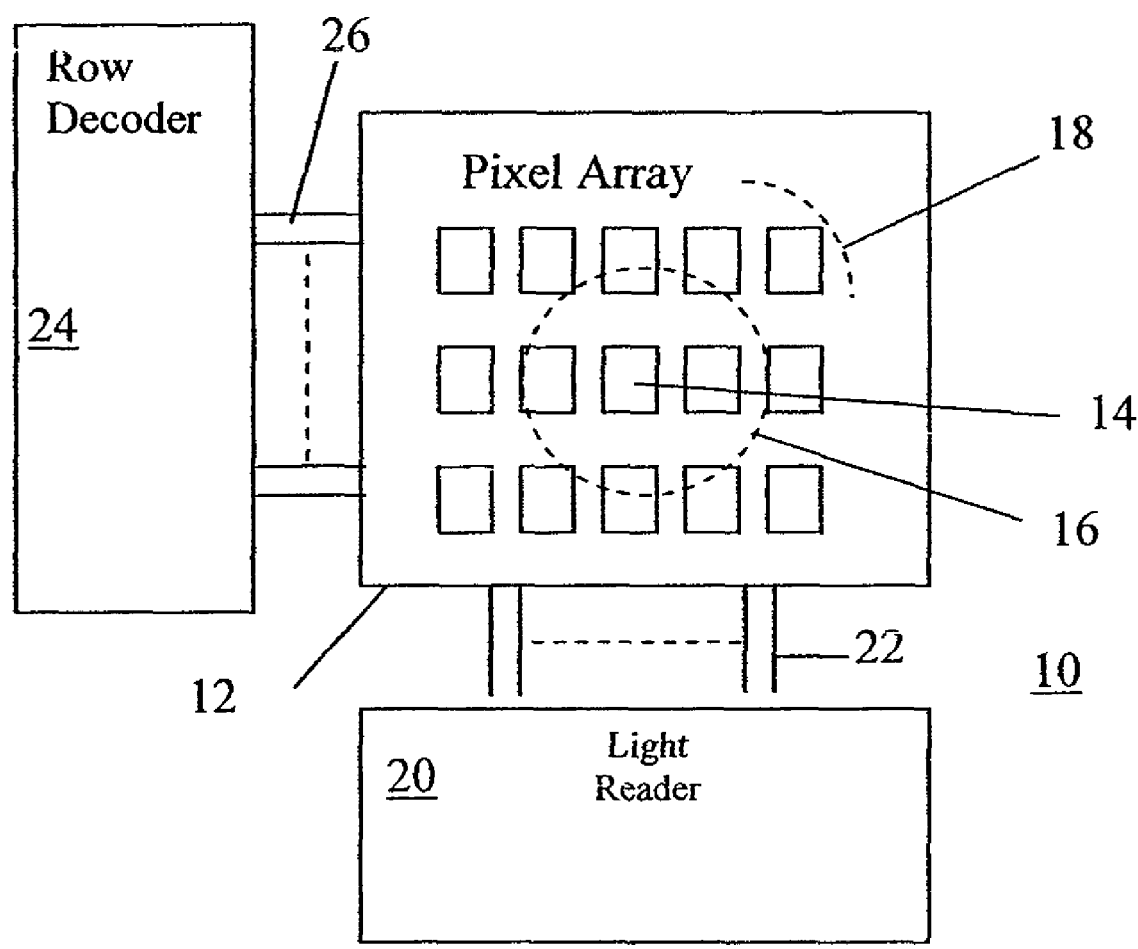
FIG. 2 is a schematic of an image sensor.

Referring to the drawings more particularly by reference numbers, FIG. 2 shows an image sensor 10. The image sensor 10 includes a pixel array 12 that contains a plurality of individual photo-detecting pixels 14, each comprising a photodiode. The pixels 14 are typically arranged in a two-dimensional array of rows and columns. The pixel array 12 has a center area 16 and corner areas 18.

The pixel array 12 is typically connected to a light reader circuit 20 by a plurality of conductive traces 22. The pixel array 12 is connected to a row decoder 24 by conductive traces 26. The row decoder 24 can select an individual row of the pixel array 12. The light reader 20 can then read specific discrete columns within the selected row. Together, the row decoder 24 and light reader 20 allow for the reading of an individual pixel 14 in the array 12. The data read from the pixels 14 may be processed by other circuits such as a processor (not shown) to generate a visual display.

The image sensor 10 and other circuitry may be configured, structured and operated in the same, or similar to, the corresponding image sensors and image sensor systems disclosed in U.S. Pat. No. 6,795,117 issued to Tay, which is hereby incorporated by reference.

Figure 1:
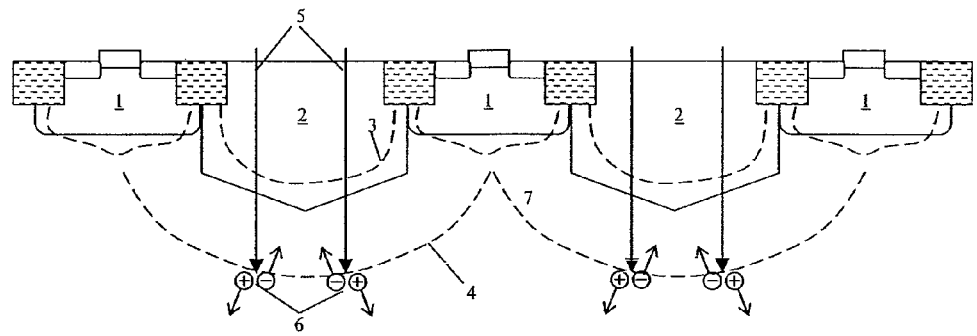
FIG. 1 is an illustration of an image sensor of the prior art.
Figure 3:
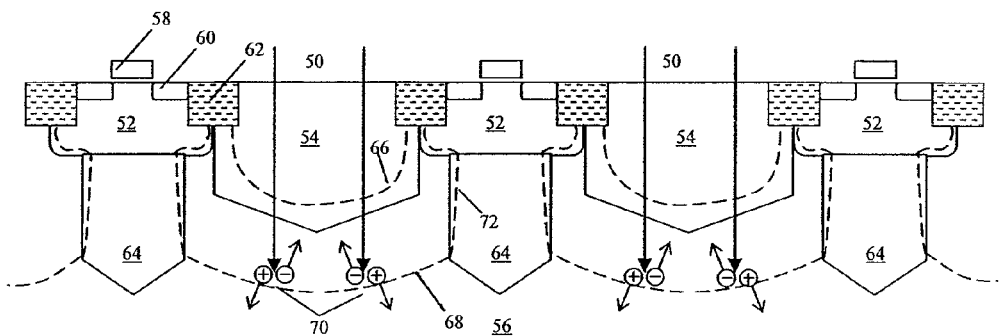
FIG. 3 is an illustration of a plurality of photodiodes of the image sensor.

FIG. 3 shows a plurality of first regions 52 constructed from a first type of material and second regions 54 constructed from a second type of material. By way of example, the first material may be an intermediately doped p-type material and the second regions 54 may be a lightly doped n-type material. The regions 52 and 54 are formed in a substrate 56. The substrate 56 may be constructed from a lightly doped p-type material. Each second region 54 and the substrate 56 constitute an n- and a p-region of a photodiode 50.

As shown in FIG. 3, each photodiode 50 may be adjacent to a gate 58 and either a source or drain pad 60 formed adjacent to the first region 52. The gate 58 may be constructed from a heavily doped n-type polysilicon material. The source/drain pad 60 may be constructed from a heavily doped n-type material. The n-type source/drain pads 60 may be separated from the n-type second regions 54 by isolation regions 62.

Adjacent to each first region 52 is a barrier region 64. The barrier region 64 may be constructed from a medium doped p-type material. The photodiodes 50 are reverse biased to create depletion regions generally within lines 66 and 68. Absorption of light and the formation of electron-hole pairs 70 at relatively long wavelengths of light will occur in the bottom portion of the depletion regions. By way of example, light with wavelengths longer than 650 nanometers tend to become absorbed at the bottom of the depletion regions.

The barrier regions 64 inhibit lateral growth of the depletion regions in the horizontal directions as represented by dashed lines 72. This prevents the depletion regions from merging and causing errant voltage variations in adjacent photodiodes. As shown in FIG. 3, the barrier regions 64 may extend as deep as the second regions 52. By way of example, the barrier regions may have a depth between 2-4 µm.

Figure 4:
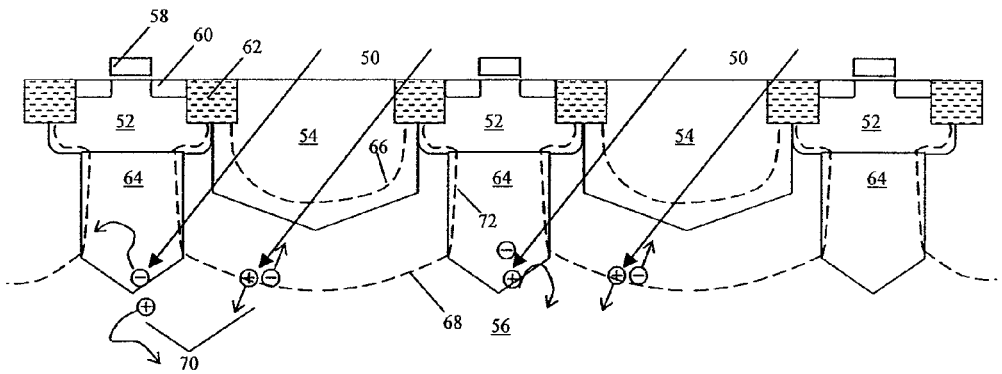
FIG. 4 is an illustration of photodiodes at a corner region of a pixel array of the image sensor.

As shown in FIG. 4, light rays penetrate the photodiodes at an obtuse angle for pixels located at the corner areas 18 of the pixel array. The angle can be as much as 30 degrees from a normal to the substrate. The incident light may be absorbed by material and form electron-hole pairs 70 in close proximity to an adjacent photodiode. The free electrons may migrate to the adjacent photodiode causing inaccurate photo-detection.

Figure 5:
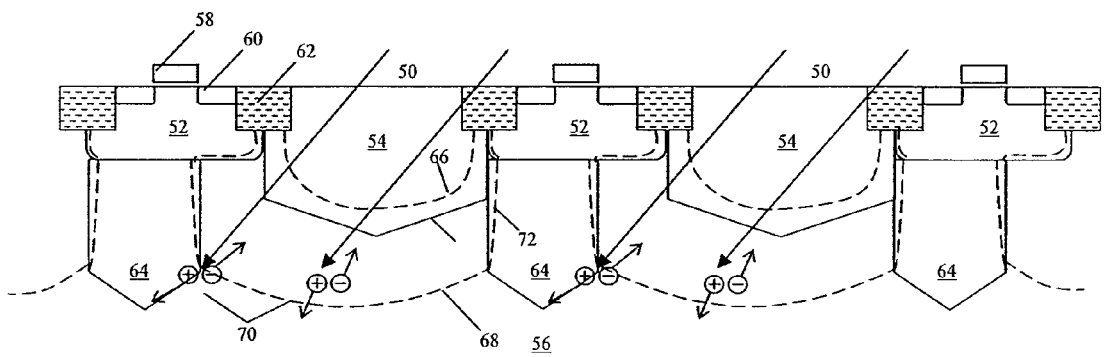
FIG. 5 is an illustration of photodiodes at the corner region, with offset barrier regions.

FIG. 5 is an embodiment where the barrier regions 64 are offset relative to the first regions 52. The offset barrier regions 64 create a longer path to an adjacent photodiode from the point when incident light is absorbed by the material. As shown in FIG. 5, the barrier regions 64 are offset to become more midway between shafts of light rays penetrating the second regions 54 on two lateral sides of the barrier regions 64 so that carriers generated by a shaft of light rays penetrating a second region 64 are generated within the depletion region that extends from the same second region 64 and, by way of example, electrons are swept into the same second region 64. The offset may vary from the center are 16 of the pixel array 12, where light penetrates the photodiodes in a perpendicular direction, to the corner areas 18 of the array 12 where the light penetrates at an obtuse angle. The offset may become progressively larger from the center area 16 of the pixel array 12 to the corner areas 18 of the array. The offset allows the depletion region to grow laterally to overlap the path of the incoming light. By way of example, the barrier regions may be offset up to 0.5 μm at the outermost pixels.

The pixel array may be constructed with known CMOS fabrication techniques. The barrier region 64 may be formed on the substrate 56. The first regions 52 may be formed on the barrier regions 64 and the gates 58 and pads 60 formed on the first regions 52. The second regions 54 may also be formed on the substrate 56. The order of formation may vary depending on the processes used to create the image sensor.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for capturing an image having a reduced crosstalk, comprising:
   providing a substrate of a first conductivity type, said substrate having embedded therein:
      a pair of second regions of a second conductivity type, each second region to be penetrated by a different shaft of light rays, and
      a barrier means for forbidding a capacitive coupling between said pair of second regions through said substrate, said barrier means buried into said substrate, away from any top interface of said substrate, said barrier means configured to be sandwiched by a pair of depletion regions each extending from a different one of said pair of second regions.

2. The method of claim 1, wherein said barrier means is closer to one of said pair of second regions than the other to be more midway between the shafts of light rays, the shafts of light rays penetrating said substrate at an obtuse angle.

3. The method of claim 1, wherein the first conductivity type is a p-type, and the second conductivity type is an n-type.

4. The method of claim 1, wherein said pair of second regions have a depth deeper than an isolation region in said substrate.

5. The method of claim 4, wherein said barrier means is closer to one of said pair of second regions than the other to be more midway between the shafts of light rays, the shafts of light rays penetrating said substrate at an obtuse angle.

6. The method of claim 4, wherein said substrate has further embedded therein a first region of the first conductivity type, said first region under a pad of a transistor and above said barrier means.

7. The method of claim 4, wherein said barrier means and said second regions share a depth.

8. The method of claim 4, wherein said barrier means comprises a region of the first conductivity type, a neutral region in said region keeping said pair of depletion regions separate.

9. The method of claim 4, wherein said barrier means has a depth in the substrate between 2 um to 4 um.

10. The method of claim 6, wherein said barrier means has a lateral offset from said first region.

11. A method for forming a pixel array, comprising:
    providing a substrate of a first conductivity type;
    forming a pair of second regions of a second conductivity type in said substrate each to be penetrated by a different shaft of light rays; and
    forming a barrier means for forbidding a capacitive coupling between said pair of second regions through said substrate, said barrier means buried into said substrate, away from any top interface of said substrate, said barrier means configured to be sandwiched by a pair of depletion regions each extending from a different one of said pair of second regions.

12. The method of claim 11, wherein said barrier means is closer to one of said pair of second regions than the other to be more midway between the shafts of light rays, the shafts of light rays penetrating said substrate at an obtuse angle.

13. The method of claim 11, further comprising:
    forming an isolation region in said substrate, said second regions having a depth deeper than said isolation region.

14. The method of claim 11, wherein said barrier means and said second regions share a depth.

15. The method of claim 11, wherein said barrier means comprises a region of the first conductivity type, a neutral region in said region keeping said pair of depletion regions separate.

16. The method of claim 11, wherein said barrier means has a depth in the substrate between 2 um to 4 um.

17. The method of claim 13, wherein said barrier means is closer to one of said pair of second regions than the other to be more midway between the shafts of light rays, the shafts of light rays penetrating said substrate at an obtuse angle.

18. The method of claim 13, further comprising:
    forming a first region of the first conductivity type, said first region under a pad of a transistor and above said barrier means.

19. The method of claim 18, wherein said barrier means has a lateral offset from said first region.

20. A method for capturing an image having a reduced crosstalk, comprising:
    providing an image sensor comprising a substrate of a first conductivity type, said substrate having embedded therein:
      an isolation region;
      a pair of second regions of a second conductivity type, said pair of second regions having a depth deeper than said isolation region, each of said pair of second regions to be penetrated by a different shaft of light rays; and
      a barrier region of the first conductivity type buried into said substrate between said pair of second regions, away from any top interface of said substrate, said barrier region being closer to one of said pair of second regions than the other to be more midway between the shafts of light rays, the shafts of light rays penetrating said substrate at an obtuse angle.

21. The method of claim 20, wherein said substrate has further embedded therein a first region of the first conductivity type, said first region under a pad of a transistor and above said barrier region.

22. The method of claim 20, wherein said pair of second regions and said barrier region share a depth.

23. The method of claim 20, wherein said barrier region has a depth in the substrate between 2 um to 4 um.

24. The method of claim 21, wherein said barrier region has a lateral offset from said first region.

25. A method for forming a pixel array of an image sensor, comprising:
    providing a substrate of a first conductivity type;
    forming an isolation region in said substrate;
    forming a pair of second regions of a second conductivity type in said substrate, said pair of second regions having a depth deeper than said isolation region, each of said pair of second regions to be penetrated by a different shaft of light rays; and
    forming a barrier region of the first conductivity type buried into said substrate between said pair of second regions, away from any top interface of said substrate, said barrier region being closer to one of said pair of second regions than the other to be more midway between the shafts of light rays, the shafts of light rays penetrating said substrate at an obtuse angle.

26. The method of claim 25, further comprising:
    forming a first region of the first conductivity type, said first region under a pad of a transistor and above said barrier region.

27. The method of claim 25, wherein said pair of second regions and said barrier region share a depth.

28. The method of claim 25, wherein said barrier region has a depth in the substrate between 2 um to 4 um.

29. The method of claim 26, wherein said barrier region has a lateral offset from said first region.

* * * * *